US006737648B2

United States Patent
Fedder et al.

(10) Patent No.: US 6,737,648 B2
(45) Date of Patent: May 18, 2004

(54) MICROMACHINED INFRARED SENSITIVE PIXEL AND INFRARED IMAGER INCLUDING SAME

(75) Inventors: Gary K. Fedder, Turtle Creek, PA (US); Hasnain Lakdawala, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 315 days.

(21) Appl. No.: 09/992,839

(22) Filed: Nov. 19, 2001

(65) Prior Publication Data

US 2003/0052271 A1 Mar. 20, 2003

Related U.S. Application Data

(60) Provisional application No. 60/252,714, filed on Nov. 22, 2000.

(51) Int. Cl.$^7$ ................................................ G01J 5/34
(52) U.S. Cl. ...................... 250/332; 250/338.1; 250/340
(58) Field of Search ................................ 250/330, 332, 250/338.1, 338.2, 338.4, 339.02, 340

(56) References Cited

U.S. PATENT DOCUMENTS

| | | | |
|---|---|---|---|
| 4,660,090 A | 4/1987 | Hynecek | |
| 4,902,895 A | 2/1990 | Hanson | |
| 4,967,082 A | 10/1990 | Cooke et al. | |
| 5,144,133 A | 9/1992 | Dudley et al. | |
| 5,420,428 A | 5/1995 | Bullington et al. | |
| 5,717,631 A | 2/1998 | Carley et al. | |
| 5,844,238 A | 12/1998 | Sauer et al. | |
| 5,965,886 A | 10/1999 | Sauer et al. | |
| 5,970,315 A | 10/1999 | Carley et al. | |
| 6,118,124 A | 9/2000 | Thundat et al. | |
| 6,469,301 B1 * | 10/2002 | Suzuki et al. | 250/338.1 |

FOREIGN PATENT DOCUMENTS

EP  0 716 293 A1  6/1996

OTHER PUBLICATIONS

Flannery et al., "Status of uncooled infrared imagers," *Infrared Imaging Systems*, SPIE vol. 1689, pp. 379–395, 1992.
Jensen, "Limitations to Room Temperature IR Imaging Systems," *Infrared Technology XIX*, SPIE vol. 2020, pp. 340–350, 1993.
Amantea et al., "An Uncooled IR Imager with 5 mK NEDT," *SPIE* vol. 3061, pp. 210–222, 1997.
Radford et al., "Microbolometer Uncooled Infrared Camera With 20 mK NETD," *SPIE Conf. on Infrared Technology and Applications XXIV*, SPIE vol. 3436, pp. 636–646, Jul. 1998.

(List continued on next page.)

*Primary Examiner*—Constantine Hannaher
*Assistant Examiner*—Timothy Moran
(74) *Attorney, Agent, or Firm*—Kirkpatrick & Lockhart LLP

(57) ABSTRACT

An infrared (IR) sensitive pixel and an IR imager including the same. According to one embodiment, the pixel includes a substrate assembly having a cavity defined by at least one sidewall and a cantilevered beam connected to the substrate assembly and disposed in the cavity. The cantilevered beam includes a first spring portion and a first capacitor plate portion, wherein the first spring portion includes at least two materials having different coefficients of thermal expansion. The pixel further includes a second capacitor plate portion, such that incident IR radiation causes the first spring portion of the cantilevered beam to move laterally relative to the sidewall, thereby creating a variable capacitance between the first capacitor plate portion of the cantilevered beam and the second capacitor plate portion.

48 Claims, 13 Drawing Sheets

OTHER PUBLICATIONS

Cole et al., "Monolithic Two–Dimensional Arrays of Micromachined Microstructures for Infrared Applications," *Proceedings of the IEEE*, vol. 86, No. 8, pp. 1679–1686, Aug. 1998.

Liu et al., "A CMOS Uncooled Heat–Balancing Infrared Imager," *IEEE Journal of Soild State Circuits*, vol. 35, No. 4, pp. 527–535, Apr. 2000.

Amantea et al., "Progress towards an Uncooled IR Imager With 5 mK NEΔT," *SPIE* vol. 3436, Jul. 1998, pp. 647–659.

Binnie et al., "An Integrated 16×16 PVDF Pyroelectric Sensor Array," *IEEE Transactions on Ultrasonics, Ferroelectrics and Frequency Control*, vol. 47, No. 6, Nov. 2000, pp. 1413–1420.

* cited by examiner

MICROMACHINED INFRARED SENSITIVE PIXEL AND INFRARED IMAGER INCLUDING SAME

CROSS-REFERENCE TO RELATED APPLICATIONS

This application claims priority to U.S. provisional patent application Serial No. 60/252,714, filed Nov. 22, 2000, which is incorporated herein by reference.

STATEMENT REGARDING FEDERALLY SPONSORED RESEARCH AND DEVELOPMENT

This research was funded in part by the U.S. Government. The U.S. Government may have certain rights in any patent awarded as provided by Grant No. F30602-97-2-0323, awarded in 1997 and Grant No. F30602-99-2-0545, awarded in 1999 by the Defense Advanced Research Projects Agency (DARPA).

BACKGROUND OF INVENTION

1. Field of Invention

The present invention relates generally to micromachining and, more particularly, to a micromachined infrared sensitive pixel that may be used in, for example, an infrared imager.

2. Description of the Background

The human eye can only gather information from the visible light region of the electromagnetic spectrum. Imaging in the infrared (IR) region of the spectrum, however, allows sensing of small differences in temperature in the environment. This ability is highly useful for surveillance and security applications as it enables detection of objects in absolute darkness. Conventional IR imagers have been in use by law enforcement and military agencies. However, conventional IR imager technology relies on semiconductor sensors, which are expensive and bulky due to the necessary cooling to liquid nitrogen temperatures (77 K). Newer uncooled imagers are based on custom materials and are expensive to fabricate.

The applications for low cost infrared imagers range from household security applications to "night vision" aids for night driving. IR sensors with high enough sensitivity (0.1 degree Kelvin) to be suitable for imaging purposes are expensive. Imagers made using conventional semiconductor technologies are very expensive and bulky, as the imagers have to be cooled to the temperature of liquid nitrogen. Newer uncooled imagers are based on custom processes that are expensive to fabricate.

Several research and development groups have created medium-performance IR imaging arrays. One example is the Honeywell uncooled bolometer array. Certain technology spearheaded by Sarnoff Laboratories and Sarcon Microsystems includes the creation of suspended bimorph microplates whose thermo-mechanical displacement is detected by measuring the capacitance of the micro-plate to the substrate. The main drawback of that approach is that the designs are difficult to manufacture due to the good control of residual stress.

Other approaches to uncooled IR imagers include the Texas Instrument Approach: An array of 25 $\mu$m–75 $\mu$m Barium Strontium Titanate (BST) detectors whose polarization and electric constant change with temperature, resulting in a change in capacitor charge as the scene temperature varies. This technology is limited by the ability to obtain good quality, very thin BST films. The best reported Noise Equivalent Difference Temperature (NEDT) for the system was 100 mK (C. Hanson, "Uncooled thermal imaging at Texas Instruments," SPIE vol. 2020, Infrared Technology XIX (1993)).

An approach by Honeywell uses an array of microbolometers with Vanadium Oxide ($VO_x$) resistors (Temperature Coefficient of Resistance (TCR) 2%/K). The bolometer is suspended by a silicon nitride bridge for thermal isolation from the substrate containing the read out electronics. The commercial products achieve a Noise Equivalent Difference Temperature (NEDT) in the range of 100 mK and have been integrated in video rate and single shot digital cameras. Recent results from Raytheon have reported a 20 mK NEDT for a 2500 $\mu m^2$ pixel size. This approach is limited by the self-heating of the pixel and 1/f noise. (B. E. Cole et al., "Monolithic Two-Dimensional Arrays of Micromachined Microstructures for Infrared Applications," *Proceedings of the IEEE*, Vol. 86, no. 8, pp. 1679–1686, 1998, and W. Radford et al., "Microbolometer Uncooled Infrared Camera with 20 mK NEDT," *SPIE Conference on IR Tech. and Applications XXIV*, San Diego, Calif., July 1998, pp.636–646.

An approach by Sarnoff Research Center senses capacitance change of a bimetallic element with the substrate. The thermal isolation is designed using a SiC suspension and the bimetallic strip includes SiC and Aluminum. The theoretical value for the NEDT using this technology is 5 mK.

Silicon infrared imagers developed at the University of Michigan use a n+polysilicon and gold thermocouple to measure the temperature difference between the pixel and the substrate. The best reported NEDT for a 200 $\mu$m by 650 $\mu$m device was 200 mK. These devices have been integrated into a standard CMOS process to achieve a NEDT of 320 mK for a 250 $\mu$m by 250 $\mu$m device. It is difficult to achieve small pixel size with this approach due to the larger number of conductors in the thermopile that increase the pixel thermal conductivity to the substrate.

Heat balancing CMOS imagers also developed at the University of Michigan use suspended CMOS transistors that are heat balanced to cancel out the incident infrared radiation. The group fabricated a 100 $\mu$m×100 $\mu$m pixel and reported a detectivity of $3\times10^7$ cm-$(Hz)^{-1/2}$/W. The thermal isolation between the substrate and the pixel is poor due to the large number of conductors incident on the pixel. The approach is limited by the size of the pixel that cannot be reduced due to etching considerations.

Pyroelectric detectors using PVDF film deposited on CMOS have been demonstrated by Binne et al, "An integrated 16×16 PVDF pyroelectric sensor array," *IEEE Transactions on Ultrasonics, Ferroelectrics and Frequency Control*, vol. 47, Issue Nov. 6, 2000, pp. 1413–1420. The main drawback to this approach is that it requires an external mechanical chopper for operation.

A brief summary of the state of the art pixels demonstrated by industry and research groups is summarized in Table 1 below.

TABLE 1

Comparison of Pixel Performance Reported in Literature

|  | Honeywell | TI approach | Active Pixel | U. Mich | Pyroelectric |
| --- | --- | --- | --- | --- | --- |
| Principle | Bolometer | Ferroelectric | Heat-balancing | Thermopile | PVDF |
| Process | Custom | Custom | CMOS | CMOS | CMOS |
| Pixel size | 50 μm × 50 μm | 50 μm × 50 μm | 100 μm × 100 μm | 250 μm × 250 μm | 105 μm × 105 μm |
| Bandwidth | 30 Hz | 30 | 30 | NA | 30 Hz |
| Noise Equivalent Power | $30 \times 10^{-12}$ W/√Hz | NA | $300 \times 10^{-12}$ W/√Hz | $330 \times 10^{-12}$ W/√Hz | $2.4 \times 10^{-11}$ W/√Hz |
| Detectivity (cm-(Hz)$^{-1/2}$/W) | $5 \times 10^8$ | NA | $3 \times 10^7$ | $7.7 \times 10^7$ | $4.4 \times 10^8$ |
| NEDT | 25 mK | 100 mK | NA | 320 mK | NA |

Accordingly, there is a need for a low cost imager that has the potential of being utilized in markets and applications that until now were not cost effective. For example, there is a need for an imager for applications such as night driving aids. IR closed circuit cameras could aid surveillance and home security systems. Low cost IR imagers can be used to identify sources of heat leaks in homes and factories leading to energy savings.

SUMMARY OF THE INVENTION

According to one embodiment, the present invention is directed to a pixel for an IR sensor. The pixel includes a substrate assembly having a cavity defined by at least one sidewall and a cantilevered beam connected to the substrate assembly and disposed in the cavity. The cantilevered beam includes a first spring portion and a first capacitor plate portion, wherein the first spring portion includes at least two materials having different coefficients of thermal expansion. The pixel further includes a second capacitor plate portion, such that incident IR radiation causes the first spring portion of the cantilevered beam to move laterally relative to the sidewall, thereby creating a variable capacitance between the first capacitor plate portion of the cantilevered beam and the second capacitor plate portion.

According to another embodiment, the pixel includes a substrate assembly, a first cantilevered beam and a second cantilevered beam. The substrate assembly includes a cavity defined by at least one sidewall. The first cantilevered beam is connected to the substrate assembly and disposed in the cavity, and includes a first spring portion and a first capacitor plate portion, wherein the first spring portion includes at least two materials having different coefficients of thermal expansion. The second cantilevered beam is also connected to the substrate assembly and disposed in the cavity, and includes a second spring portion and a second capacitor plate portion, wherein the second spring portion includes at least two materials having different coefficients of thermal expansion, such that incident IR radiation causes the first and second spring portions to move laterally relative to the sidewall thereby creating a variable capacitance between the first and second capacitor plate portions.

According to another embodiment, the present invention is directed to a micromachined structure. The micromachined structure includes a substrate assembly having a cavity defined by at least one sidewall. The micromachined structure also includes a first cantilevered beam connected to the substrate assembly and disposed in the cavity. The first cantilevered beam includes a first spring portion and a first capacitor plate portion, wherein the first spring portion includes at least two materials having different coefficients of thermal expansion. In addition, the micromachined structure includes a second capacitor plate portion, such that incident IR radiation causes the first spring portion of the first cantilevered beam to move laterally relative to the sidewall, thereby creating a variable capacitance between the first capacitor plate portion of the first cantilevered beam and the second capacitor plate portion.

According to another embodiment, the present invention is directed to an infrared (IR) imager including an addressing circuit and a pixel array coupled to the addressing circuit. The pixel array includes a plurality of IR sensitive pixels, wherein each pixel includes first and second cantilevered beams. The first cantilevered beam is connected to a substrate assembly and disposed in a cavity of the substrate assembly, wherein the cavity is defined by a sidewall. The first cantilevered beam includes a first spring portion and a first capacitor plate portion, wherein the first spring portion includes at least two materials having different coefficients of thermal expansion. The second cantilevered beam is also connected to the substrate assembly and disposed in the cavity. The second cantilevered beam includes a second spring portion and a second capacitor plate portion, wherein the second spring portion includes at least two materials having different coefficients of thermal expansion, such that incident IR radiation causes the first and second spring portions to move laterally relative to the sidewall thereby creating a variable capacitance between the first and second capacitor plate portions.

BRIEF DESCRIPTION OF THE FIGURES

Embodiments of the present invention are described in conjunction with the following figures, wherein.

DETAILED DESCRIPTION OF THE INVENTION

Figure 1:
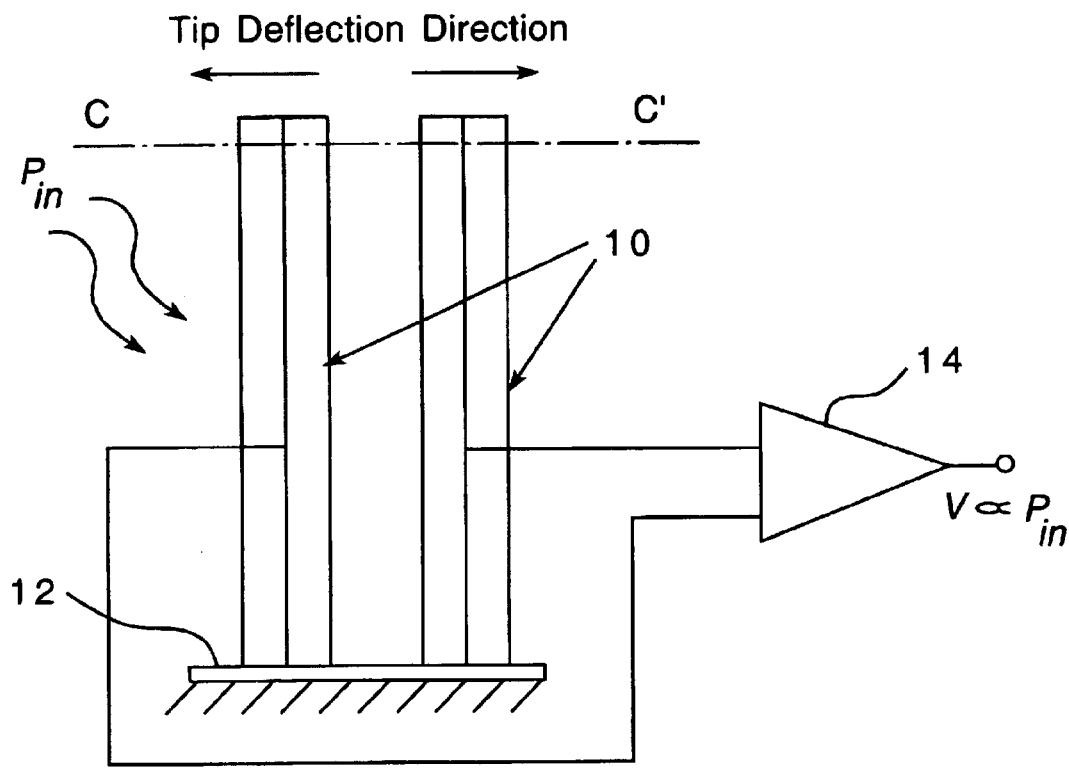
FIGS. 1 and 2 are diagrams illustrating a principle of operation according to one embodiment of the present invention.
Figure 2:
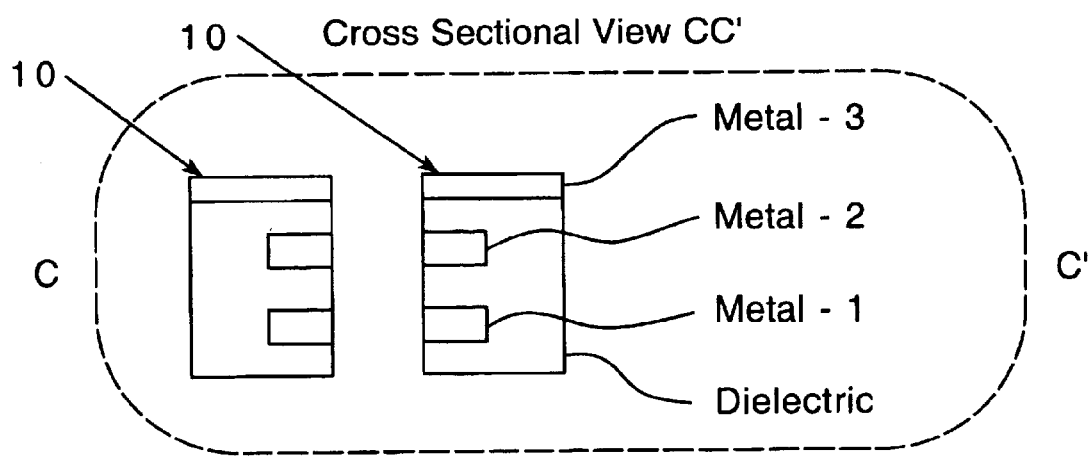

According to one embodiment, the present invention is directed to a micromachined infrared (IR) sensitive pixel. The operating principle of the IR pixel, according to one embodiment, is described in conjunction with FIGS. 1 and 2. FIG. 1 illustrates two micromachined beams 10 anchored to a substrate assembly 12. The beams 10 may be, for example, CMOS micromachined beams having a cross-section along line C–C' in FIG. 1 as illustrated in FIG. 2. That is, the beams 10 may include both dielectric and metal layers. As illustrated in FIG. 2, the metal layers for the left-hand beam may be oriented on the right-hand side of the beam, and the metal layers for the right-hand beam may be oriented on the left-hand side of the beam.

The metal layers of the beams 10 may be, for example, aluminum such that the temperature coefficient of expansion (TCE) of the aluminum metal layers ($23 \times 10^{-6}$ K$^{-1}$) is much greater than that of the CMOS inter-layer dielectric ($0.4 \times 10^{-6}$ K$^{-1}$). Thus, if a temperature change is induced in the beams due to incident IR energy ($P_{in}$), then a lateral bending moment is produced. The beam bending is proportional to a difference in the TCE of the metal layers and the inter-layer dielectric. The lateral motion increases the inter-beam separation and decreases the capacitance between the beams. This change in capacitance may be measured by circuitry 14, such as an integrated CMOS capacitance-to-voltage converter, which may output a voltage proportional to the power of the incident IR energy.

The lateral motion ($\delta$) at the tip of a beam 10 of length L, width w, thickness t, and effective Young's Modulus E can be expressed as:

$$\delta = \frac{L^2}{2}\left(\frac{M_l}{EI_{zz}}\right) = \frac{6L^2 M_l}{Etw^3} \quad (1)$$

where $M_l$ is the lateral bending due to the beam cross-section and $I_{zz}$ is the moment of inertia about the z axis expressed as $$I_{zz} = \frac{1}{12}tw^3.$$

It should be noted that out-of-plane curl of the two beams 10 is substantially identical and does not contribute to performance degradation.

Figures 3, 4:
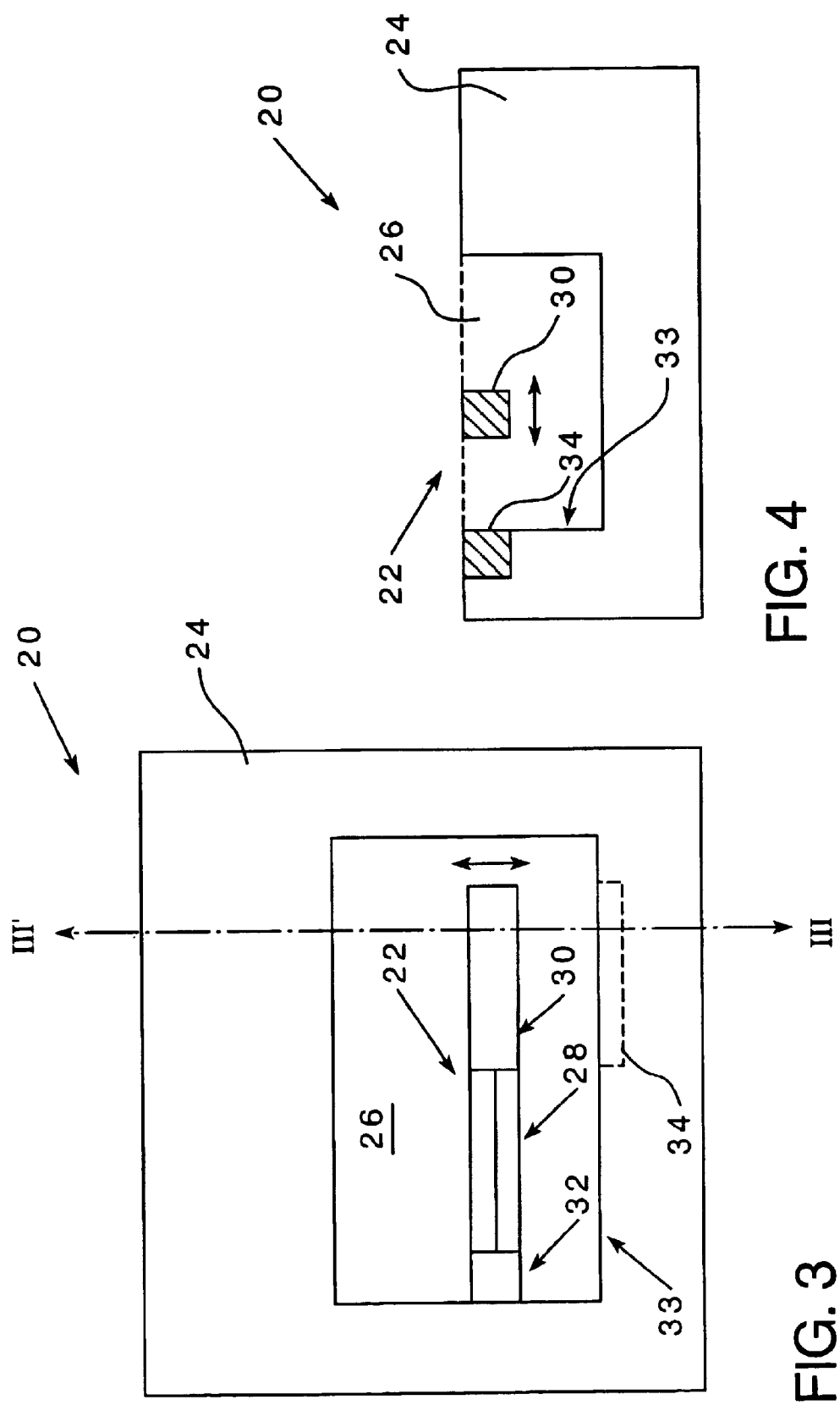
FIG. 3 is a top plan view of an infrared sensitive pixel according to one embodiment of the present invention.
FIG. 4 is a cross-sectional side-view of the pixel of FIG. 3.

FIGS. 3 and 4 illustrate a micromachined IR sensitive pixel 20 according to one embodiment of the present invention. FIG. 3 is a top plan view of the pixel 20 and FIG. 4 is a cross-sectional view of the pixel 20 along line III–III'. As illustrated in these figures, the pixel 20 includes a cantilevered beam 22 connected to a substrate assembly 24 and disposed in a cavity 26 defined by the substrate assembly. According to one embodiment, the beam 22 may be a CMOS micromachined beam, i.e., a beam having dielectric (such as silicon dioxide) and metal (such as aluminum) layers fabricated according to CMOS processing techniques, such as a standard 0.5 µm 3-metal CMOS process.

As used herein, the term "cantilevered beam" is not limited to straight beams, but may also include, for example, meandering, serpentine or curved beams. In addition, the term "substrate assembly" as used herein refers to a substrate and any intervening layers or structures formed thereon or therein. The term "substrate" refers to a structure that is often the lowest layer of semiconductor material in a wafer or die, although in some technologies the substrate is not a semiconductor material.

The beam 22 may include, for example, a spring portion 28, a capacitive plate portion 30 and a thermal isolation portion 32. The spring portion 28 may include at least two materials having different temperature coefficients of expansion (TCE) aligned along the longitudinal axis of the beam 22. According to one embodiment, the spring portion 28 may be a CMOS micromachined structure having, for example, multiple aluminum layers and a silicon dioxide inter-layer dielectric aligned along the longitudinal axis of the beam 22. The TCE for aluminum is $23 \times 10^{-6}$ K$^{-1}$ and the TCE for silicon dioxide is $0.4 \times 10^{-6}$ K$^{-1}$. Thus, as explain previously, incident IR radiation impinging upon the spring portion 28 and capacitive plate portion 30 will cause the beam 22 to move laterally relative to, for example, a sidewall 33 defining the cavity 26. The lateral movement of the spring portion 28 will in turn cause the capacitive plate portion 30 to move laterally, as indicated by the arrows in FIGS. 3 and 4.

The capacitive plate portion 30 includes an electrically conductive material. For example, according to one embodiment the capacitive plate portion 30 may include one or more CMOS metal layers (not shown). In addition, the substrate assembly 24 may include a capacitive plate portion 34 adjacent the capacitive plate portion 30 of the beam 22. According to one embodiment, the capacitive plate portion 34 of the substrate assembly 24 may include one or more CMOS metal layers. Accordingly, lateral movement by the capacitive plate portion 30 of the beam 22 will cause the capacitance between the capacitive plate portions 30, 34 to vary in inverse proportion to their separation distance. This capacitance may be sensed by circuitry, such as solid-state circuitry integrated into the substrate assembly 24, to thereby determine the power of the incident IR radiation as described previously.

The thermal isolation portion 32 may provide an electrical connection between the capacitive plate portion 30 of the beam 22 and the substrate assembly circuitry while minimizing the thermal conductivity therebetween. In that way, the incident IR radiation may be effectively isolated in the beam 22 rather than dissipated in the substrate assembly 24. According to one embodiment, as explained further hereinafter, the thermal isolation portion 32 may include a polysilicon interconnect layer to provide the electrical connection to the capacitive plate portion 30.

Figure 6:
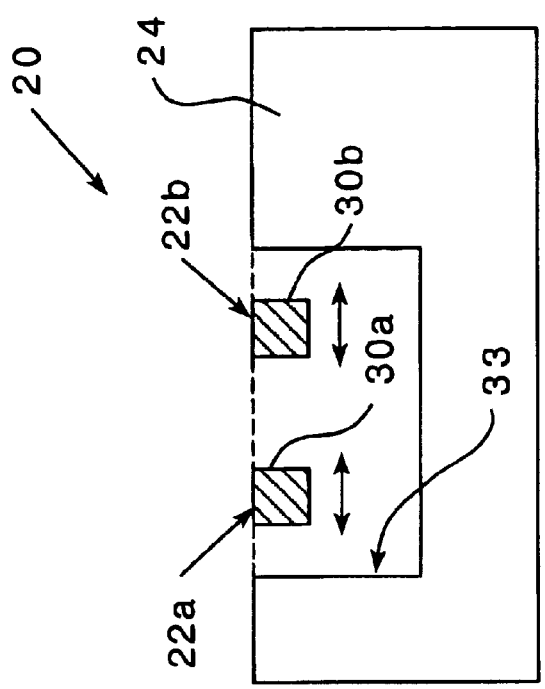
FIG. 6 is a cross-sectional side-view of the pixel of FIG. 5.
Figure 5:
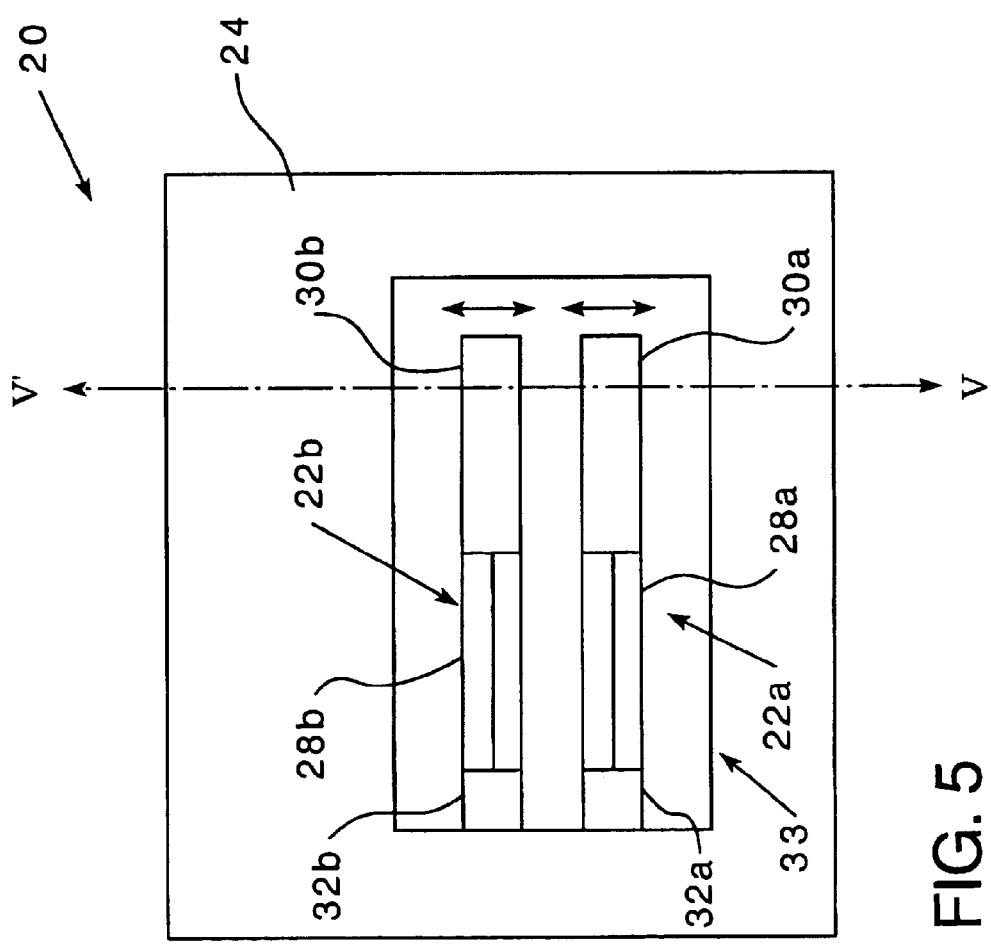
FIG. 5 is a top plan view of an infrared sensitive pixel according to another embodiment of the present invention.

FIGS. 5 and 6 illustrate the pixel 20 according to another embodiment of the present invention. FIG. 5 is a top plan view of the pixel 20 and FIG. 6 is cross-sectional view of the pixel 20 along line V–V'. As illustrated in FIGS. 5 and 6, the pixel 20 may include two cantilevered beams 22a–b. As described previously, each beam 22a–b may respectively include a spring portion 28a–b, a capacitive plate portion 30a–b and a thermal isolation portion 32a–b. According to such an embodiment, the capacitive plate portions 30a–b form a capacitor. As explained previously, the metal layers of spring portion 28a may be oriented on the side of the beam 22a adjacent to beam 22b and the metal layers of spring portion 28b may be oriented on the side of the beam 22b adjacent to beam 22a, or vice versa. In that way, incident IR radiation causes each of the spring portions 28a–b to move laterally, but in opposite directions, relative to the sidewall 33 of the cavity, thereby causing the capacitance between the capacitive plate portions 30a–b to vary. The capacitance between the capacitive plate portions 30a–b may be sensed, for example, by solid-state circuitry integrated in the substrate assembly 24.

Although the pixels described previously and hereinafter are described in the context of an IR sensitive pixel, it should be noted that the micromachined structure might be used for other purposes, such as a lateral actuator, a lateral resonant sensor and a temperature sensor.

Figure 7:
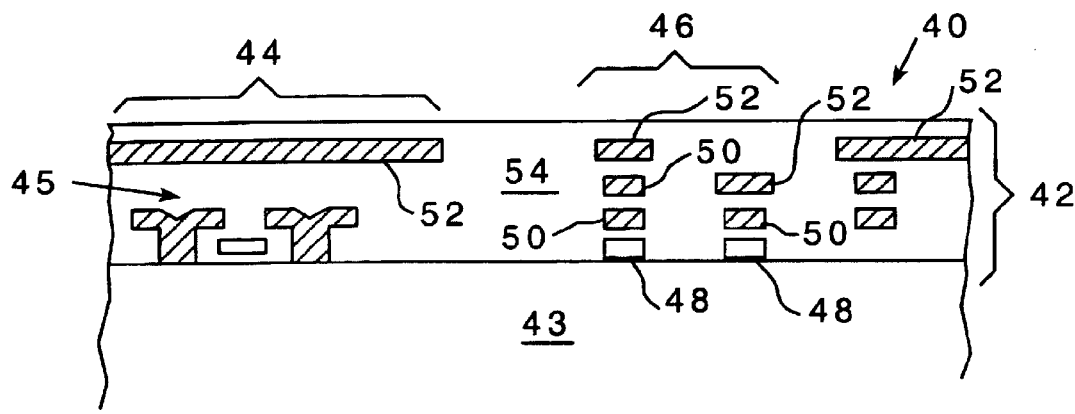
FIGS. 7–9 illustrate a technique for fabricating an infrared sensitive pixel according to one embodiment of the present invention.
Figure 8:
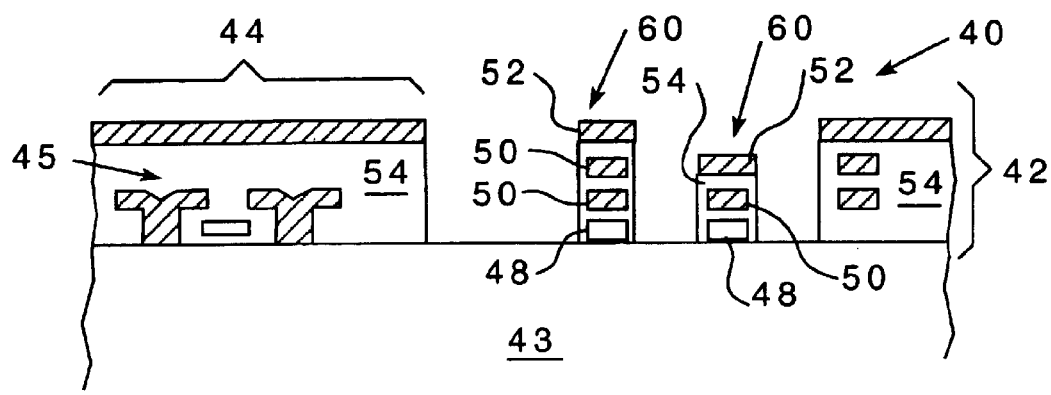
Figure 9:
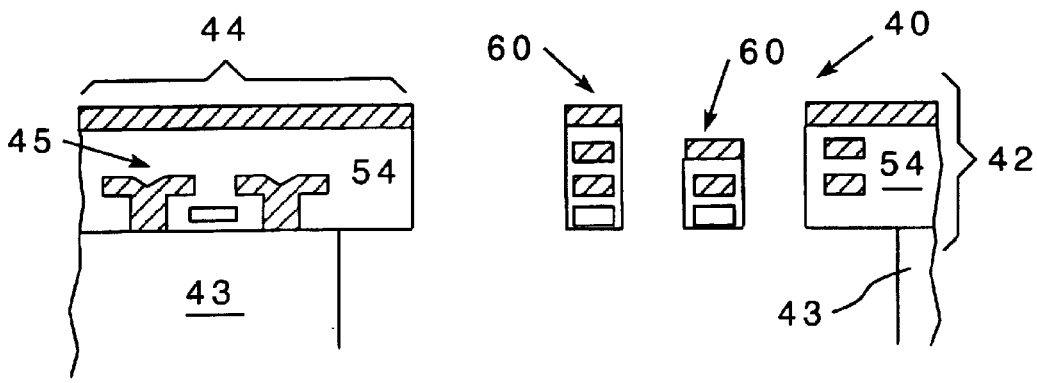

FIGS. 7–9 illustrate a process for fabricating a pixel 20 according to an embodiment of the present invention. FIG. 7 illustrates a cross-sectional view of a substrate assembly 40 having a circuitry layer 42 formed on a substrate 43. The circuitry layer 42 may be, for example, a CMOS circuitry layer, including CMOS circuitry regions 44 and CMOS interconnect regions 46, formed on the substrate 43 according to conventional CMOS fabrication techniques. The CMOS circuitry regions 44 may include, for example, CMOS circuits 45. For an embodiment in which the circuitry layer 42 is a CMOS circuitry layer, as illustrated in FIG. 7, the CMOS circuitry layer 42 may include polysilicon layers 48, intermediate metal layers 50, and upper metal layers 52. The CMOS circuitry layer 42 may also include dielectric layers 54. The dielectric layers 54 may be, for example, an oxide layer such as, for example, silicon dioxide. The thickness of the CMOS circuitry layer 42 may be, for example, 5–7 μm. The substrate 43 may be, for example, a bulk silicon mass and may have a thickness of, for example, 400–800 μm.

FIG. 8 illustrates the substrate assembly 40 after micromachining of the circuitry layer 42. In the illustrated embodiment, portions of the dielectric layers 54 of the CMOS circuitry layer 42 have been removed by a reactive ion etch (RIE). The upper metal layers 52 act as the etching mask such that only those portions of the dielectric layers 54 exposed by the upper metal layers 54 are removed. RIEs are directional (anisotropic), such that a number microstructures 60 having well-defined sidewalls are formed. As in the illustrated embodiment, the microstructures 60 may include CMOS dielectric layers 54 and metal layers 50,52. The RIE may be performed with, for example, $CHF_3$ as the etchant gas in an $O_2$ plasma. CMOS micromachining processes used to create CMOS microstructures are further described in U.S. Pat. No. 5,717,631 entitled "Microelectromechanical Structure and Process of Making Same" to Carley et al., and U.S. Pat. No. 5,970,315, entitled "Microelectromechanical Structure and Process of Making Same" to Carley et al., which are incorporated herein by reference.

FIG. 9 illustrates the substrate assembly 40 after an isotropic etch to remove portions of the substrate 43. According to one embodiment, a RIE may be used for the isotropic etch using, for example, sulfur hexafluoride ($SF_6$) as the etchant gas in an $O_2$ plasma. As illustrated in FIG. 9, the isotropic etching step releases the microstructures 60 from the substrate 43 to form cantilevered beams. In another embodiment a RIE may be first used for a directional etch of the substrate 43, followed by an isotropic etch.

Figure 10:
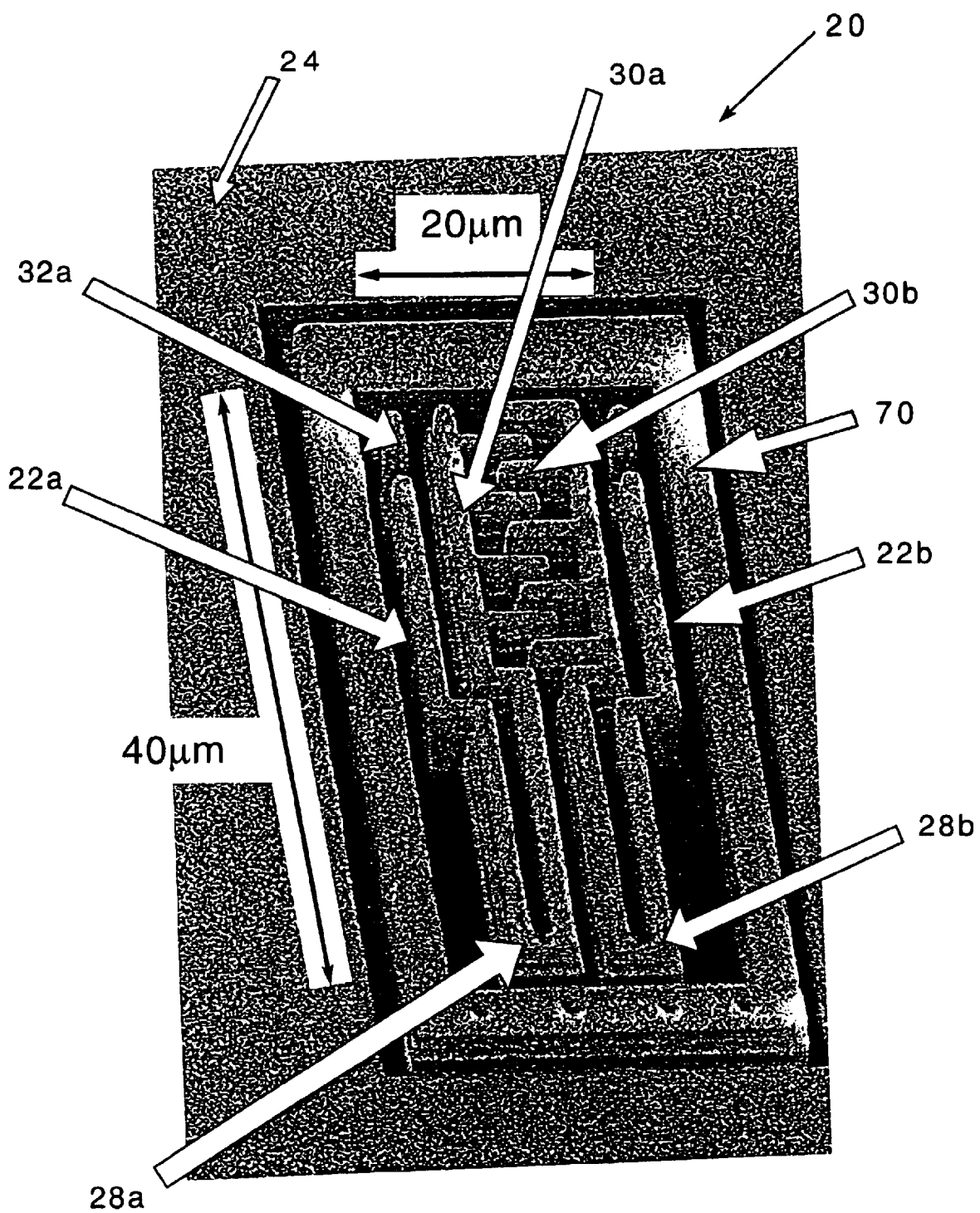
FIG. 10 is a scanning electron micrograph (SEM) image of a pixel according to another embodiment of the present invention.

FIG. 10 is a scanning electron micrograph (SEM) image of a pixel 20 according to another embodiment of the present invention. As can be seen in FIG. 10, the beams 22a–b may have a meandering or folded shape. In addition, the capacitive plate portions 30a–b of the beams may include protruding finger beams configured to form an interdigitated capacitor. That is, the finger beams of the respective capacitive plate portions 30a–b are interleaved. The meandering shape design for the beams 22a–b of the illustrated embodiment maximizes the tip deflection of the spring portions 28a–b within the pixel area. Further, the interdigitated capacitor structure increases the capacitance of the pixel 20, hence increasing the sensitivity thereof. The dimensions for the pixel 20 given in FIG. 10 are exemplary.

The pixel 20 of FIG. 10 additionally includes a micromachined frame 70 connected to the substrate assembly 24 around the beams, which may be fabricated according to the conventional micromachining techniques such as those previously described. The frame 70 may include an embedded heater (not shown), which may be used to test the pixel 20 or to provide a temperature offset during operation. According to one embodiment, the structures of the beams 22a–b may be designed so that they have different mechanical resonant frequencies. For example, the mechanical resonant frequency of the beam 22a may be 245 kHz and the mechanical resonant frequency of the beam 22b may be 230 kHz.

Figures 11, 12:
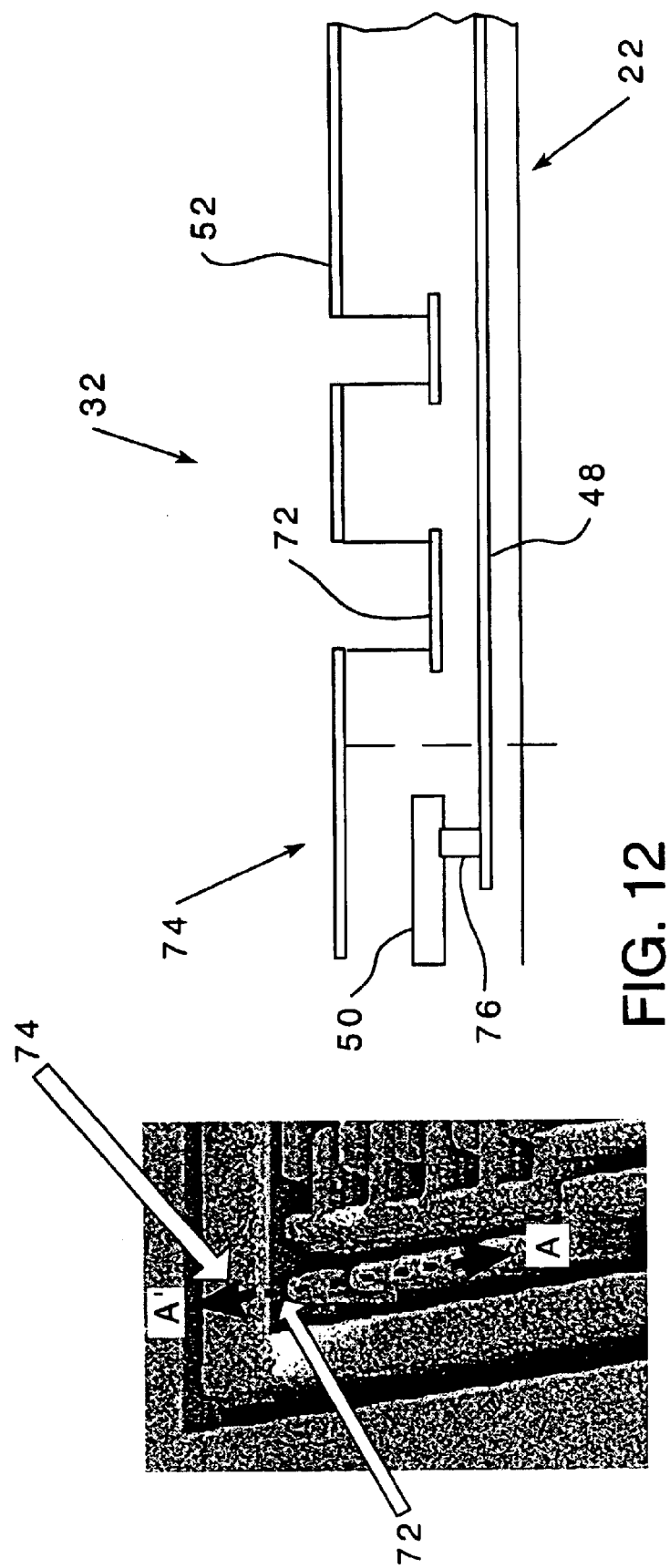
FIG. 11 is a SEM image of a thermal isolation portion of the pixel of FIG. 10.
FIG. 12 is a cross-sectional side-view of the thermal isolation portion of FIG. 11.

FIG. 11 is a SEM image of the thermal isolation portion 32 of a beam of the pixel and FIG. 12 is a cross-sectional view of the thermal isolation portion 32 along line A–A'. According to the illustrated embodiment, the thermal isolation portion 32 includes slotted metal lines 72. The slots in the beam 22 interrupt the metallization layers of the microstructure, such as the upper metal layer 52, thereby decreasing the thermal conductivity between the capacitive plate portion of the beam and the substrate assembly. Electrical conductivity between circuitry in the substrate assembly and the capacitive plate portion of the beam may be provided by polysilicon interconnect layer 48. According to one embodiment, the polysilicon interconnect layer 48 may have a width of, for example, 0.6 μm.

The anchor portion 74 of the substrate assembly may include an electrically conductive via 76 to provide an electrical connection between the polysilicon interconnect layer 48 and the metal interconnect layer 50 of the substrate assembly circuitry. The via 76 may be made of metal such as, for example, tungsten or aluminum.

Figure 13:
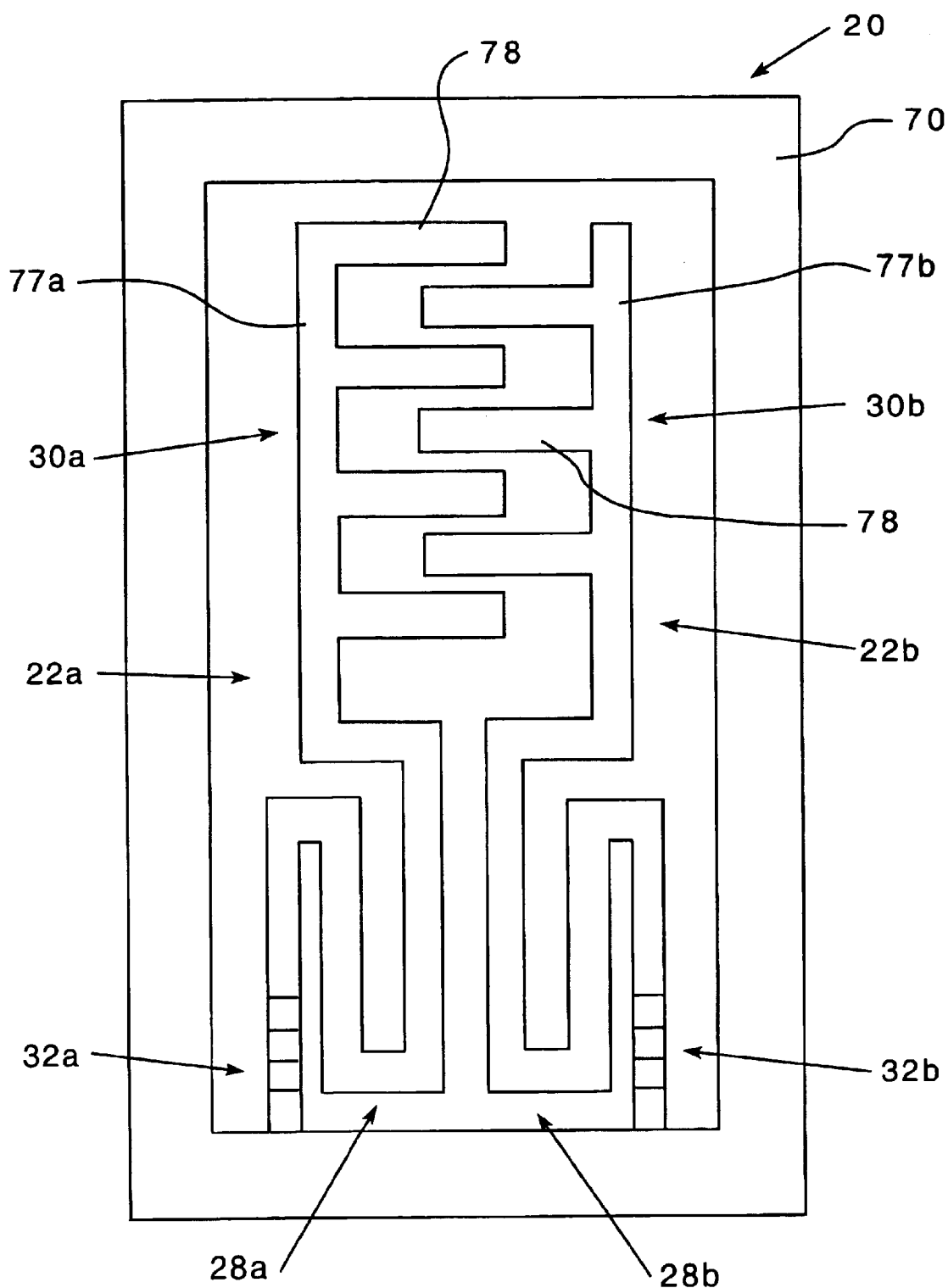
FIG. 13 is a top plan view of a pixel according to another embodiment of the present invention.

The beams 22 of the pixel 20 may take on numerous different configurations. FIG. 13 is a top view of a pixel configuration according to another embodiment of the present invention. Like the embodiment illustrated in FIG. 10, the capacitive plate portions 30a–b of the beams 22a–b in FIG. 13 form an interdigitated capacitor. According to the illustrated embodiment, each capacitive plate portion 30a–b includes a main beam 77a–b having a number of finger beams 78 extending therefrom. The finger beams 78 from the respective capacitive plate portions 30a–b are interleaved to thereby form the interdigitated capacitor. During fabrication, the different residual stresses in the embedded layers of the spring portions 28a–b cause the finger beams 78 to move closer together after the mechanical release from the substrate, described previously, to thereby improve device sensitivity.

Figure 14:
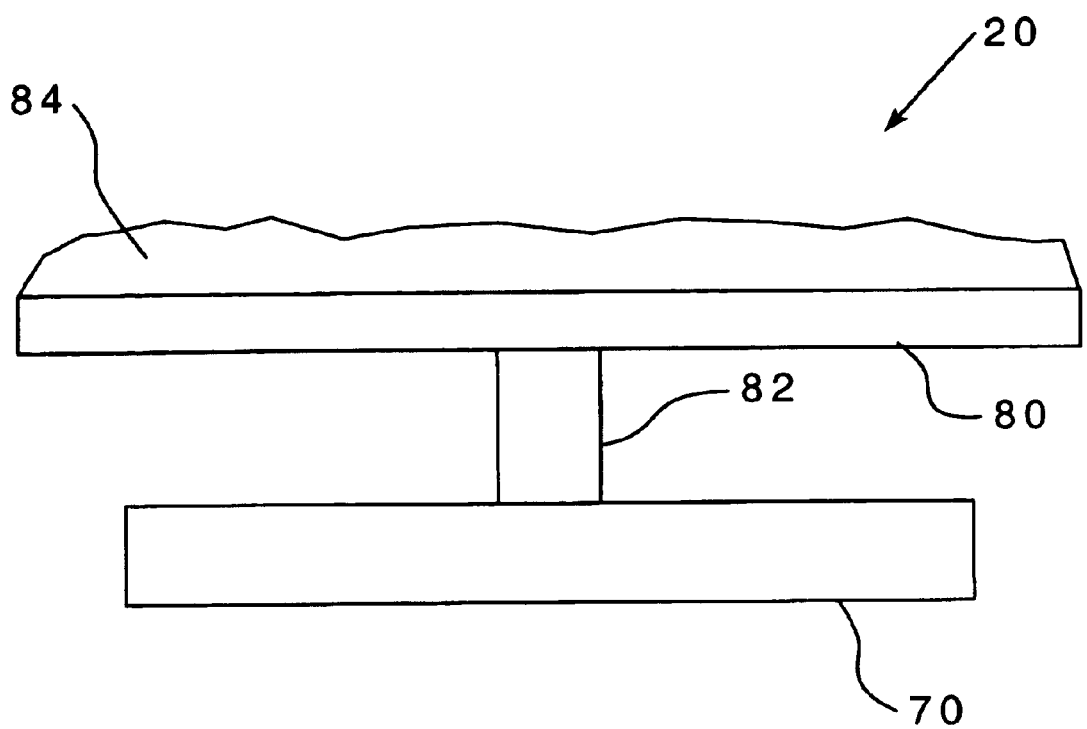
FIG. 14 is a side-view of a pixel according to another embodiment of the present invention.

To enhance the efficiency of the IR sensitive pixels 20 described herein, an IR absorbing material (not shown) may be deposited on the pixel 20 such as, for example, by sputtering. The IR absorbing material may be, for example, platinum black, gold black or carbon black. According to another embodiment, the IR absorbing material may be deposited on a plate over the pixel. FIG. 14 is a side-view of a pixel 20 according to such an embodiment. As illustrated in FIG. 14, a plate 80 made of, for example, a thermally conductive material such as aluminum, is located over the beams (not shown) and supported by a post 82 connected to the frame 70. In this case, the thermal isolation portions between the frame 70 and the beams 28a–b may be omitted. The IR absorbing material 84 is deposited on the plate 80. The post 82 may also made of a thermally conductive material such as aluminum. Although only one post 82 is shown in FIG. 14, more than one post may be employed if necessary to support the plate. According to other embodiments, such as for pixels 20 that do not include a frame, the post(s) 82 may be directly connected to the beams 28a–b.

Figure 15:
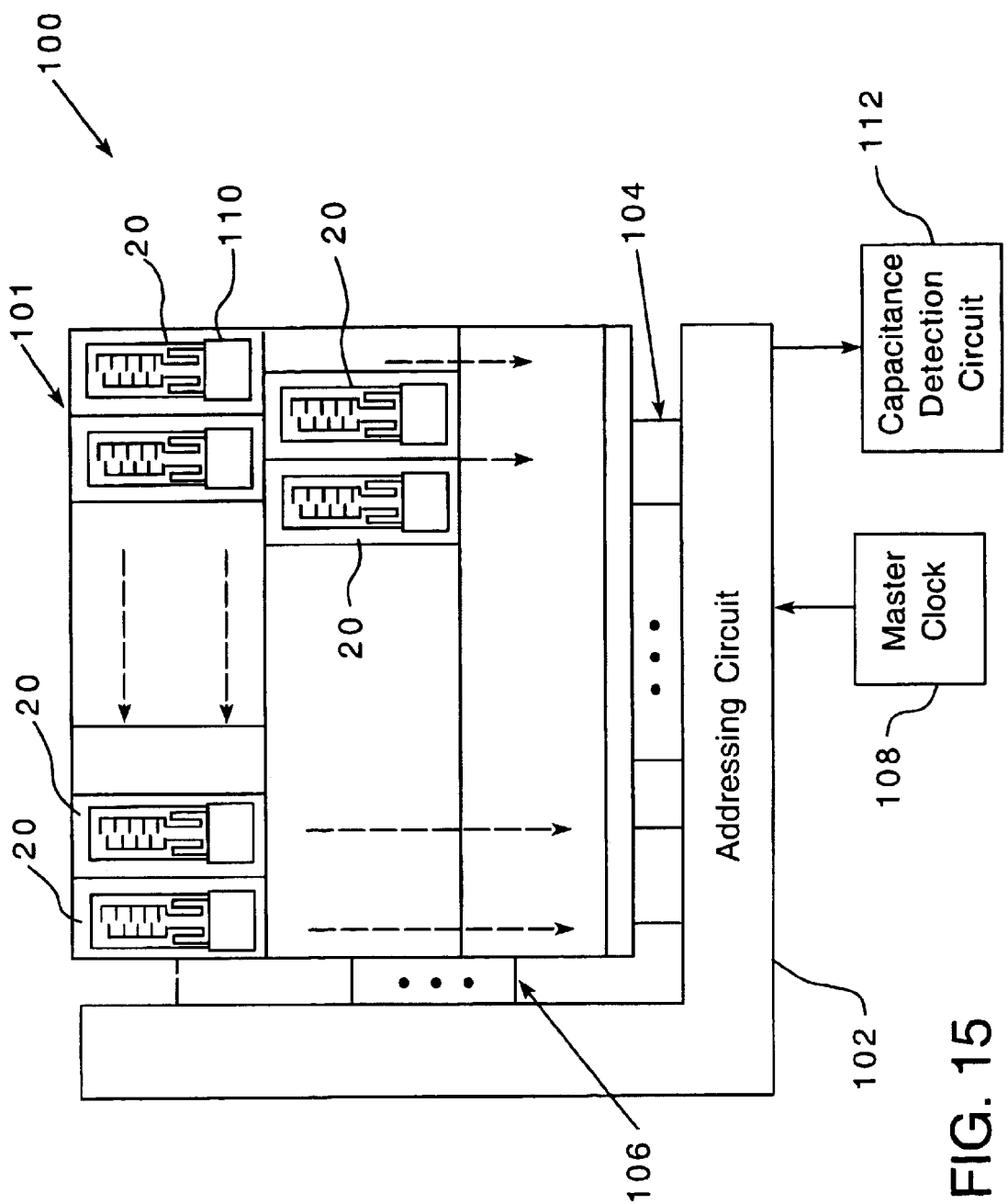
FIG. 15 is a diagram of an infrared (IR) imager according to one embodiment of the present invention.

Pixels according to the present invention may be used in an infrared (IR) imager. FIG. 15 is a diagram of an IR imager 100 according to one embodiment of the present invention. According to one embodiment, the IR imager 100 may be integrated onto a single chip (or die). As illustrated in FIG. 15, the imager 100 includes an array 101 of pixels 20 having N columns and M rows. The pixels 20 may be individually addressed by an addressing circuit 102 once every image scan. A pixel 20 in the M-th row and the N-th column may be selected when, for example, a N-th column bit line 104 and a M-th row bit line 106 are driven to a logic high by the addressing circuit 102. The addressing circuit 102 may include, for example, shift registers and may be synchronized by a master clock 108. A capacitance detection circuit 112 may be coupled to the addressing circuit 102 to sense the change in capacitance of the addressed pixel.

Figure 16:
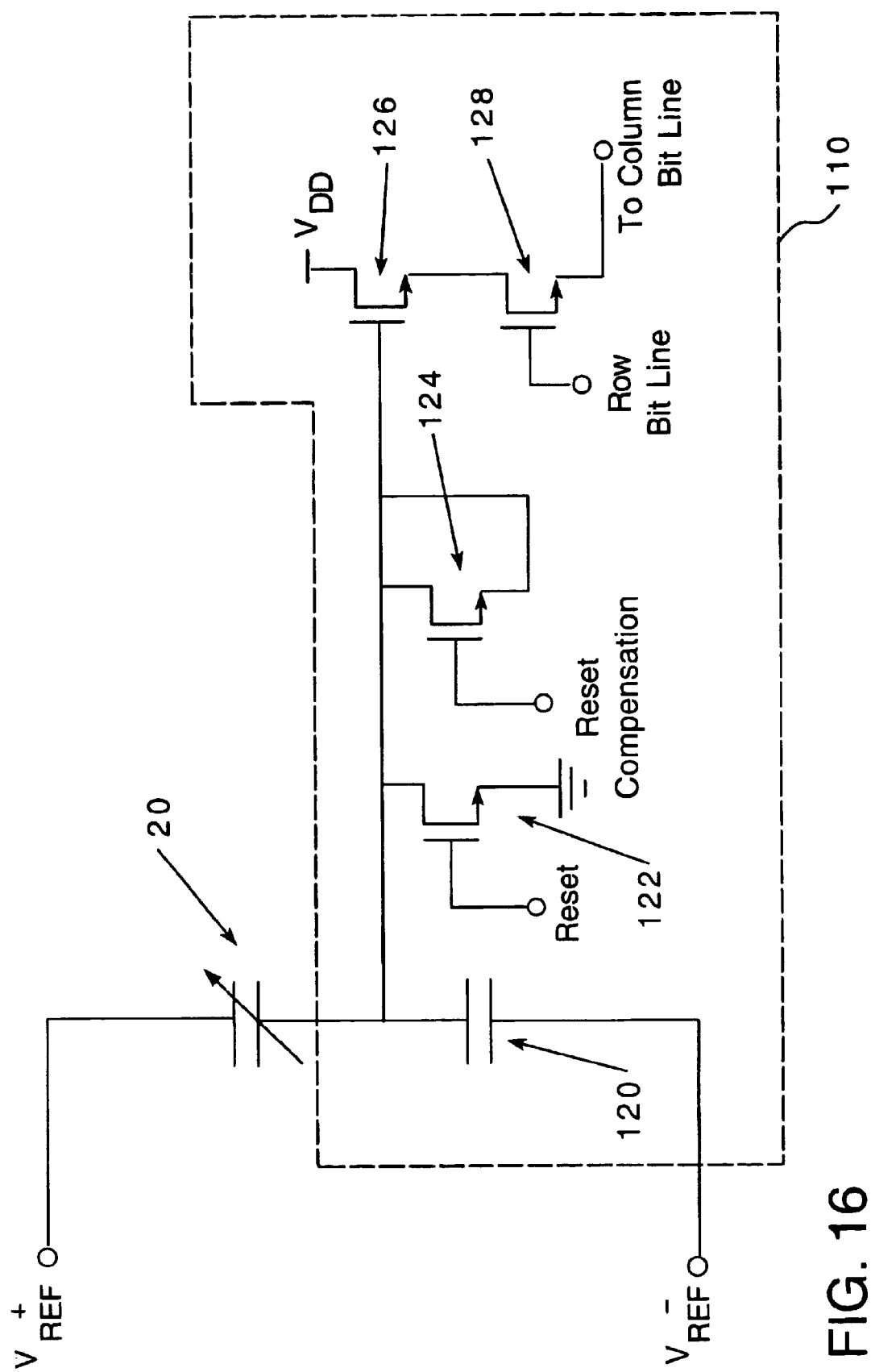
FIG. 16 is a schematic diagram of an interface circuit of the IR imager of FIG. 15 according to one embodiment of the present invention.

Each pixel 20 may include an interface circuit 110 coupled to the addressing circuit 102. FIG. 16 is a diagram of the interface circuit 110 according to one embodiment of the present invention. In FIG. 16 the pixel 20 is represented as a variable capacitor, which is coupled to a reference capacitor 120. According to one embodiment, the capacitance of the reference capacitor 120 may be 5 fF. The circuit 110 also includes a shared source follower configuration including, for example, NMOS field effect transistors (FETs) 122, 124, 126 and 128. The first transistor 122 may be controlled by a reset signal and the second transistor 124 may be controlled by a reset compensation signal. The control terminal of the transistor 126 is coupled to the common node between the pixel 20 and the reference capacitor 120, and the source of the transistor 126 is coupled to the drain of the transistor 128. The transistor 128 is driven by the row bit line select signal from the addressing circuit 102, and the source of the transistor 128 is coupled to a column bit line from the addressing circuit 102. The capacitance bridge formed by the pixel 20 and the reference capacitor 120 may be driven by two out of phase signals, $V_{REF}^+$ and $V_{REF}^-$, which enable, as described hereinafter, double correlated sampling based capacitor detection. Any initial mismatch between the pixel 20 and reference capacitor 120 may be eliminated by adjusting the ratio between the positive and negative reference voltages, $V_{REF}^+$ and $V_{REF}^-$. The transistors 122 and 124 may be used to set the DC voltage at the output. Switch injection errors may be reduced by driving the transistor 124 with a signal (the reset compensation signal) that is a delayed and inverted version of the reset signal driving the transistor 122.

Figure 17:
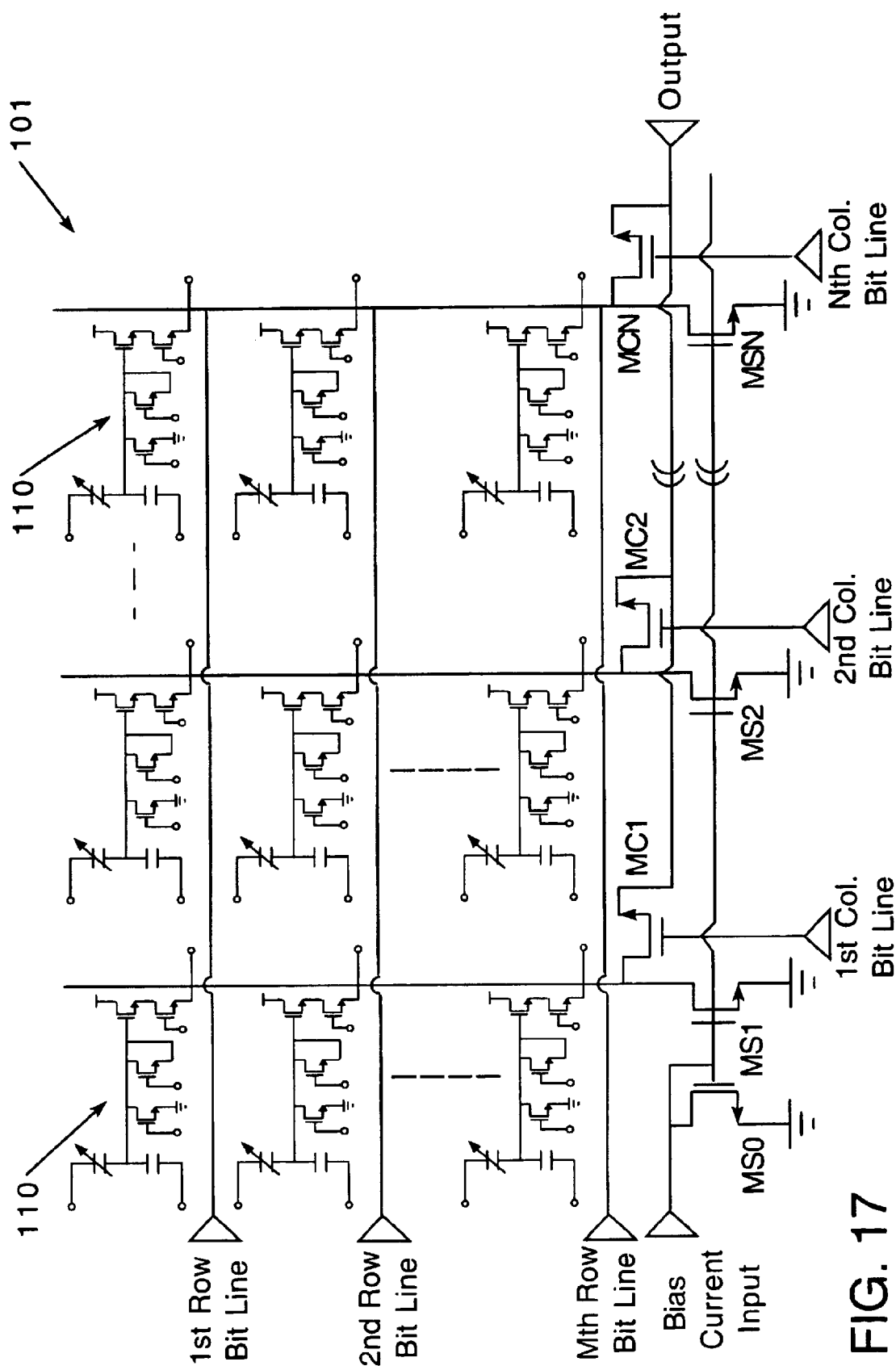
FIG. 17 is a schematic diagram of the array of the IR imager of FIG. 15 according to one embodiment of the present invention.

FIG. 17 is a schematic of the array 101 of the imager 100 according to one embodiment. The active column is selected by, for example, a logic high on the appropriate column bit line from the addressing circuit (not shown) and the active pixel is selected, for example, by a logic high on the row bit lines from the addressing circuit. The capacitance detection circuit 112 may be shared by each pixel 20 of the array 101.

Figure 18:
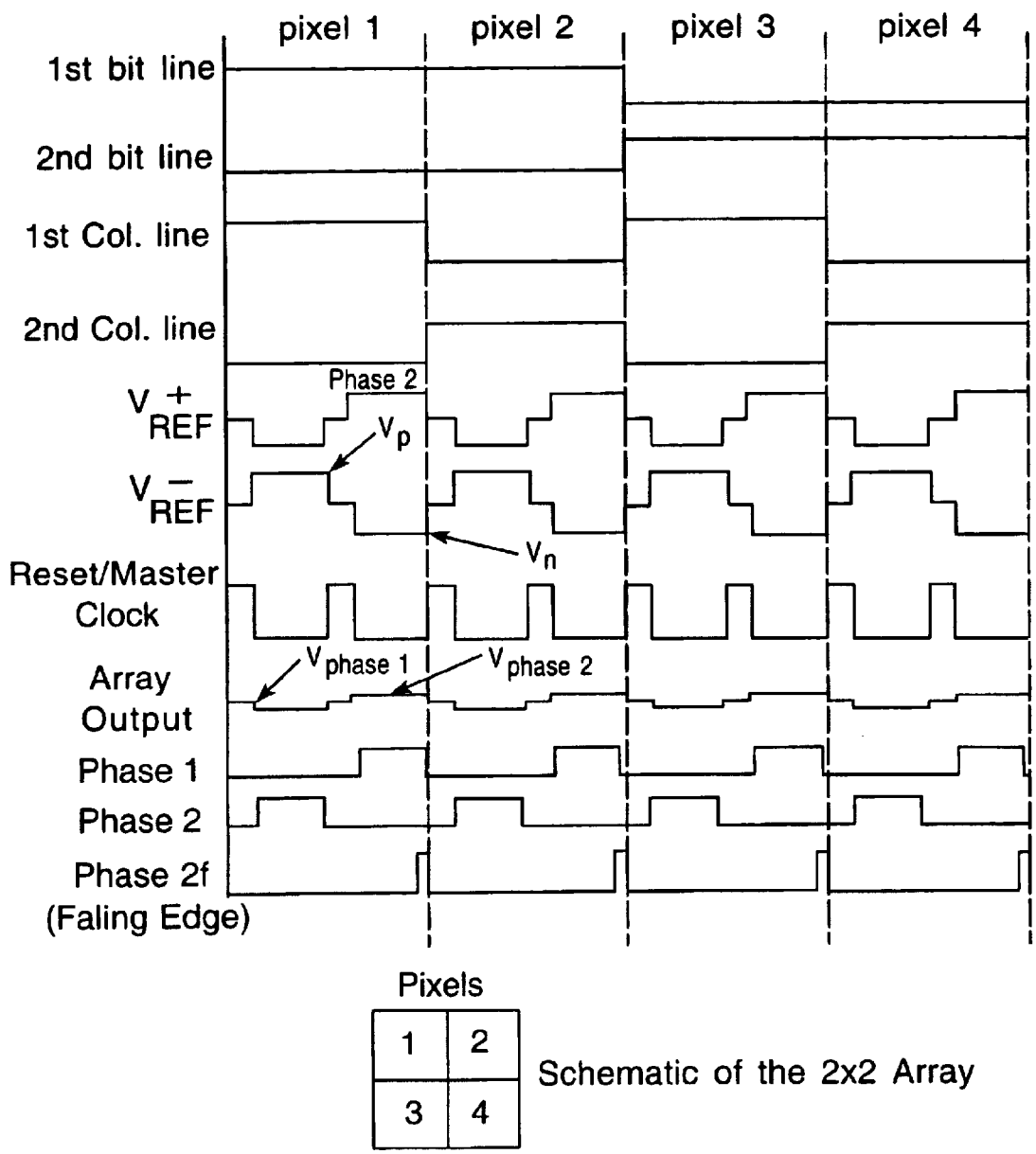
FIG. 18 illustrates a clocking scheme for an IR imager according to one embodiment of the present invention.

FIG. 18 illustrates a sample clocking scheme for a 2×2 pixel array. The $V_{REF}^+$ and $V_{REF}^-$ analog signals are input to the capacitive bridge as shown in FIG. 16 and may be centered around analog ground. The frequency of the sampling is related to the scan rate of the image. The master clock frequency may be obtained by the relation:

$$F_{clock}=2(N)(M)(S)(n) \quad (2)$$

where N is the number of columns, M is the number of rows, S is the scan rate of the image, and n is the number of pixel output measurements made per cycle. For a 16×16 array, operating at 30 frames per second and one measurement per cycle, the master clock frequency would be 15.36 kHz.

Figure 19:
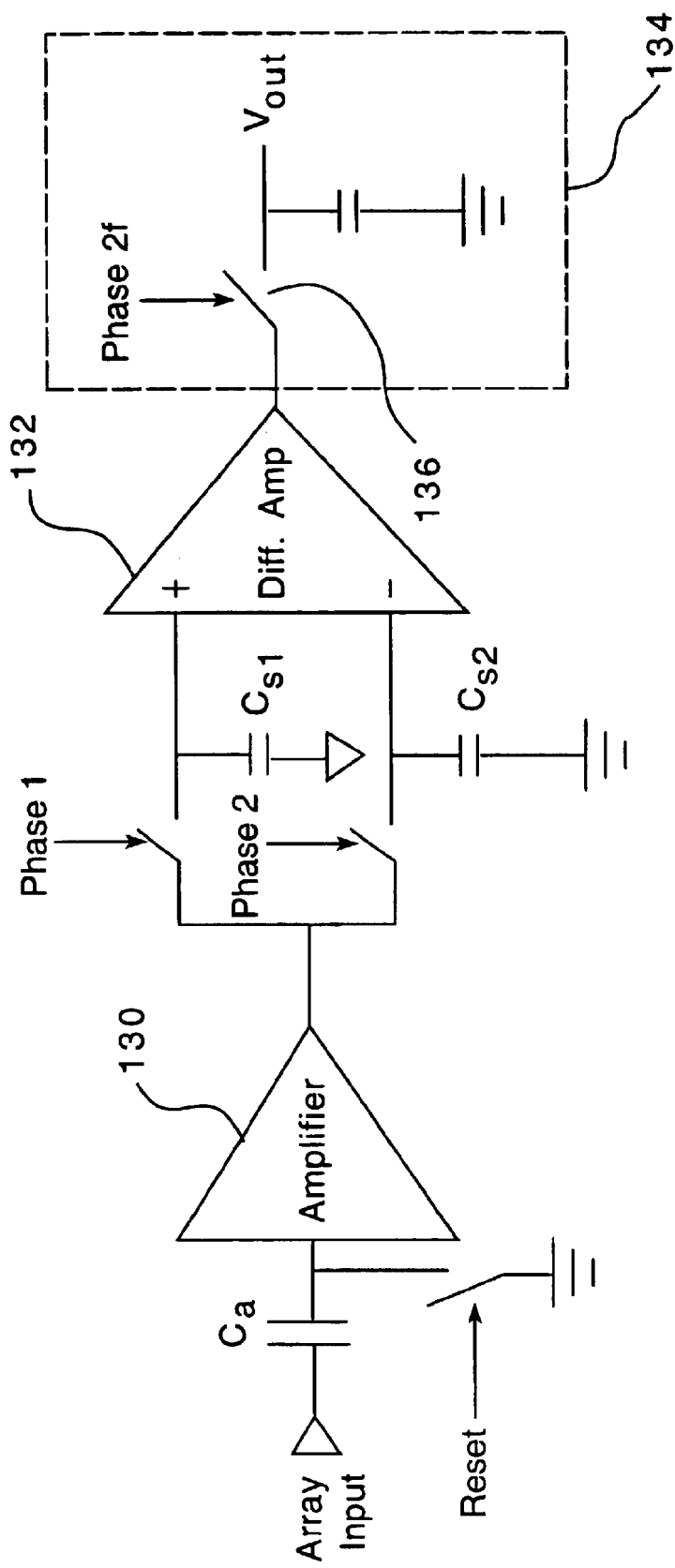
FIG. 19 is a schematic diagram of the capacitance detection circuit of the IR imager of FIG. 15 according to one embodiment of the present invention.

FIG. 19 is a schematic diagram of the capacitance detection circuit 112 according to one embodiment of the present invention using double correlated sampling to generate an output voltage $V_{out}$ that is proportional to the change in capacitance of the pixel 20 relative to the reference capacitor 120 (see FIG. 16). The output from the pixel interface circuit 110 is coupled to a capacitor $C_a$ that samples the DC offset voltage introduced by the interface circuit 110. The signal is amplified by an amplifier 130, and then the output, clocked by sampling signals phase1 and phase2, is sampled on capacitors $C_{s1}$ and $C_{s2}$ respectively. The difference is calculated by a differential amplifier 132 and latched by a sample-and-hold circuit 134. The switch 136 of the sample-and-hold circuit 134 may be driven by sampling signal phase2 such that the output is valid on the falling edge of phase2.

The pixel performance of an initial design is summarized in Table 2. For a given pixel area, optimal design is a careful trade-off between the area of the pixel and the thermal isolation. The Noise Equivalent Difference Temperature (NEDT) is the minimum temperature difference at the image source that the pixel can sense. NEDT can be improved to a certain extent by improving the thermal isolation, as the thermal time constant must be low enough to accommodate the image frame rate. However, the NEDT of 50 mK for this design example does not include the performance boost from energy absorption enhancements.

TABLE 2

Sample Pixel Performance

| Symbol | Definition | Value | Unit |
|---|---|---|---|
| A | Micromechanical pixel area | 588 | $(\mu m)^2$ |
| $L_{finger}$ | Finger Beam length | 25 | $\mu m$ |
| $L_{spring}$ | Spring length | 20 | $\mu m$ |
| $V_{mod}$ | Modulation voltage | 3 | V |
| F | F number of optics | 1 | — |
| G | Fill Factor | 68 | % |
| $S_p$ | Positional sensitivity (FEA) | 416 | A/K |
| $S_c$ | Capacitance sensitivity (FEA) | 160 | aF/K |
| $R_{thermal}$ | Thermal isolation resistance | $3.31 \times 10^6$ | K-s/J |
| $R_{radiation}$ | Radiative coupling resistance | $9.87 \times 10^6$ | K-s/J |
| $C_{thermal}$ | Thermal capacity | $6.79 \times 10^{-9}$ | J/K |
| $\tau_{thermal}$ | Thermal constant | 21 | ms |
| $\beta$ | Thermal transfer function | 123 | — |
| $\Delta T_{thermal}$ | Thermal noise | 35.8 | $\mu K(Hz)^{-1/2}$ |
| $\Delta T_{photon}$ | Photon noise | 2.46 | $\mu K(Hz)^{-1/2}$ |
| $\Delta T_{amp}$ | Amplifier noise (CDS switched capacitor) | 52.7 | $\mu K(Hz)^{-1/2}$ |

TABLE 2-continued

Sample Pixel Performance

| Symbol | Definition | Value | Unit |
|---|---|---|---|
| $\Delta T_{scene}$ | Total noise referred to the scene | 8.75 | $mK(Hz)^{-1/2}$ |
| Detectivity | Detectivity | $3 \times 10^9$ | $cm(Hz)^{1/2}/W$ |
| NEP | Noise equivalent power | $4.02 \times 10^{-9}$ | W |
| NEDT | NEDT (@ 30 Hz) | 6.08 | mK |

The fill factor of the device, that determines the radiative coupling from the scene to the device, can be improved by integrating an array of, for example, silicon microlenses to focus infrared energy on the pixel. The microlens array may be, for example, integrated on the backside of the chip to decrease assembly costs.

The presence of sidewall area increases the radiative absorption area of the device. Sidewall infrared energy absorption may be enhanced be design and control of the etch depth during isotropic release of the microstructures.

An advantage of the present invention that may be realized in certain embodiments thereof is that a relatively large gap (10–20 μm) may be formed between the thermal mass of the pixel and the underlying substrate assembly. This large gap may have negligible thermal conductance relative to the thermal conductance of the pixel beams 22, which makes operation of an uncooled IR imager at atmospheric pressure feasible.

Although the present invention has been described herein with respect to certain embodiments, those of ordinary skill in the art will recognize that many modifications and variations of the present invention may be implemented. The foregoing description and the following claims are intended to cover all such modifications and variations.

What is claimed is:

1. A pixel for an IR sensor, comprising:
   a substrate assembly having a cavity defined by at least one sidewall;
   a cantilevered beam connected to the substrate assembly and disposed in the cavity, the cantilevered beam including a first spring portion and a first capacitor plate portion, wherein the first spring portion includes at least two materials having different coefficients of thermal expansion; and
   a second capacitor plate portion, such that incident IR radiation causes the first spring portion of the cantilevered beam to move laterally relative to the sidewall, thereby creating a variable capacitance between the first capacitor plate portion of the cantilevered beam and the second capacitor plate portion.

2. The pixel of claim 1, wherein the cantilevered beam further includes a first thermal isolation portion between the substrate assembly and the first spring portion.

3. The pixel of claim 1, wherein the cantilevered beam includes a CMOS micromachined beam.

4. The pixel of claim 1, wherein the first spring portion includes a metal layer and a dielectric layer with different coefficients of thermal expansion.

5. The pixel of claim 4, wherein the metal layer includes aluminum and the dielectric layer includes silicon dioxide.

6. A pixel for an IR sensor, comprising:
   a substrate assembly having a cavity defined by at least one sidewall;
   a first cantilevered beam connected to the substrate assembly and disposed in the cavity, the first cantilevered beam including a first spring portion and a first capacitor plate portion, wherein the first spring portion includes at least two materials having different coefficients of thermal expansion; and
   a second cantilevered beam connected to the substrate assembly and disposed in the cavity, the second cantilevered beam including a second spring portion and a second capacitor plate portion, wherein the second spring portion includes at least two materials having different coefficients of thermal expansion such that incident IR radiation causes the first and second spring portions to move laterally relative to the sidewall thereby creating a variable capacitance between the first and second capacitor plate portions.

7. The pixel of claim 6, wherein:
   the first cantilevered beam further includes a first thermal isolation portion between the substrate assembly and the first spring portion; and
   the second cantilevered beam further includes a second thermal isolation portion between the substrate assembly and the second spring portion.

8. The pixel of claim 6, wherein:
   the first cantilevered beam includes a CMOS micromachined beam; and
   the second cantilevered beam includes a CMOS micromachined beam.

9. The pixel of claim 6, wherein:
   the first spring portion includes a metal layer and a dielectric layer with different coefficients of thermal expansion; and
   the second spring portion includes a metal layer and a dielectric layer with different coefficients of thermal expansion.

10. The pixel of claim 9, wherein:
    the metal layer of the first spring portion includes aluminum and the dielectric layer of the first spring portion includes silicon dioxide; and
    the metal layer of the second spring portion includes aluminum and the dielectric layer of the second spring portion includes silicon dioxide.

11. The pixel of claim 6, wherein:
    the first cantilevered beam has a shape selected from the group consisting of straight, meandering and curved; and
    the second cantilevered beam has a shape selected from the group consisting of straight, meandering and curved.

12. The pixel of claim 6, further comprising a frame connected to the substrate assembly and positioned around the first and second cantilevered beams.

13. The pixel of claim 12, further comprising:
    at least one post connected to the frame;
    a plate connected to the post; and
    an IR absorbing material located on the plate.

14. The pixel of claim 6, wherein:
    the first capacitor plate portion includes a beam having a plurality of finger beams extending therefrom; and
    the second capacitor plate portion includes a beam having a plurality of finger beams extending therefrom such that the finger beams of the first capacitor plate portion are interleaved with the finger beams of the second capacitor plate portion.

15. The pixel of claim 6 wherein a resonant mechanical frequency of the first cantilevered beam does not equal a resonant mechanical frequency of the second cantilevered beam.

16. The pixel of claim 6, further comprising:
at least one post connected to one of the first and second cantilevered beams;
a plate connected to the post; and
an IR absorbing material located on the plate.

17. A micromachined pixel for an IR sensor, comprising:
a substrate assembly having a cavity defined by at least one sidewall;
a first CMOS micromachined, cantilevered beam connected to the substrate assembly and disposed in the cavity, the first CMOS micromachined, cantilevered beam including a first spring portion and a first capacitor plate portion, wherein the first spring portion includes a metal layer and a dielectric layer having different coefficients of thermal expansion; and
a second CMOS micromachined cantilevered beam connected to the substrate assembly and disposed in the cavity, the second cantilevered beam including a second spring portion and a second capacitor plate portion, wherein the second spring portion includes a metal layer and a dielectric layer having different coefficients of thermal expansion, such that incident IR radiation causes the first and second spring portions to move laterally relative to the sidewall thereby creating a variable capacitance between the first and second capacitor plate portions.

18. The pixel of claim 17, wherein:
the first CMOS micromachined, cantilevered beam further includes a first thermal isolation portion between the substrate assembly and the first spring portion; and
the second CMOS micromachined cantilevered beam further includes a second thermal isolation portion between the substrate assembly and the second spring portion.

19. The pixel of claim 18, wherein:
the first thermal portion includes at least one slotted metal line; and
the second thermal portion includes at least one slotted metal line.

20. The pixel of claim 19, further comprising a frame connected to the substrate assembly and positioned around the first and second CMOS micromachined, cantilevered beams.

21. The pixel of claim 20, further comprising:
at least one post connected to the frame;
a plate connected to the post; and
an IR absorbing material located on the plate.

22. The pixel of claim 19, wherein:
the first capacitor plate portion includes a beam having a plurality of finger beams extending therefrom; and
the second capacitor plate portion includes a beam having a plurality of finger beams extending therefrom such that the finger beams of the first capacitor plate portion are interleaved with the finger beams of the second capacitor plate portion.

23. The pixel of claim 19, further comprising:
at least one post connected to one of the first and second CMOS micromachined, cantilevered beams;
a plate connected to the post; and
an IR absorbing material located on the plate.

24. The pixel of claim 17, wherein a resonant mechanical frequency of the first CMOS micromachined, cantilevered beam does not equal a resonant mechanical frequency of the second CMOS micromachined, cantilevered beam.

25. A micromachined structure, comprising:
a substrate assembly having a cavity defined by at least one sidewall;
a first cantilevered beam connected to the substrate assembly and disposed in the cavity, the first cantilevered beam including a first spring portion and a first capacitor plate portion, wherein the first spring portion includes at least two materials having different coefficients of thermal expansion; and
a second capacitor plate portion, such that incident IR radiation causes the first spring portion of the cantilevered beam to move laterally relative to the sidewall, thereby creating a variable capacitance between the first capacitor plate portion of the first cantilevered beam and the second capacitor plate portion.

26. The micromachined structure of claim 25, wherein the first cantilevered beam further includes a first thermal isolation portion between the substrate assembly and the first spring portion.

27. The micromachined structure of claim 25, wherein the first cantilevered beam includes a CMOS micromachined beam.

28. The micromachined structure of claim 25, wherein the second capacitor plate portion is part of a second cantilevered beam that is connected to the substrate assembly and disposed in the cavity, the second cantilevered beam including a spring portion connected to the second capacitor plate portion, wherein the second spring portion includes at least two materials having different coefficients of thermal expansion, such that incident IR radiation causes the second spring portion to move laterally relative to the sidewall.

29. The micromachined structure of claim 28, wherein:
the first capacitor plate portion includes a beam having a plurality of finger beams extending therefrom; and
the second capacitor plate portion includes a beam having a plurality of finger beams extending therefrom such that the finger beams of the first capacitor plate portion are interleaved with the finger beams of the second capacitor plate portion.

30. The micromachined structure of claim 25, further comprising a frame connected to the substrate assembly and positioned around the first and second cantilevered beams.

31. An infrared (IR) imager, comprising:
an addressing circuit; and
a pixel array coupled to the addressing circuit, wherein the pixel array includes a plurality of IR sensitive pixels, each pixel including:
a first cantilevered beam connected to a substrate assembly and disposed in a cavity of the substrate assembly, wherein the cavity is defined by a sidewall, wherein the first cantilevered beam includes a first spring portion and a first capacitor plate portion, and wherein the first spring portion includes at least two materials having different coefficients of thermal expansion; and
a second capacitor plate portion, such that incident IR radiation causes the first spring portion of the cantilevered beam to move laterally relative to the sidewall, thereby creating a variable capacitance between the first capacitor plate portion of the first cantilevered beam and the second capacitor plate portion.

32. The IR imager of claim 31, wherein the first cantilevered beam further includes a first thermal isolation portion between the substrate assembly and the first spring portion.

33. The IR imager of claim 31, wherein the first cantilevered beam includes a CMOS micromachined beam.

34. The IR imager of claim 31, wherein the second capacitor plate portion is part of a second cantilevered beam that is connected to the substrate assembly and disposed in the cavity, the second cantilevered beam including a spring portion connected to the second capacitor plate portion, wherein the second spring portion includes at least two materials having different coefficients of thermal expansion, such that incident IR radiation causes the second spring portion to move laterally relative to the sidewall.

35. The IR imager of claim 34, wherein:

the first capacitor plate portion includes a beam having a plurality of finger beams extending therefrom; and the second capacitor plate portion includes a beam having a plurality of finger beams extending therefrom such that the finger beams of the first capacitor plate portion are interleaved with the finger beams of the second capacitor plate portion.

36. The IR imager of claim 31, further comprising a frame connected to the substrate assembly and positioned around the first and second cantilevered beams.

37. The IR imager of claim 31, further comprising an interface circuit coupled to each pixel.

38. The IR imager of claim 37, further comprising a capacitance detection circuit coupled to the addressing circuit.

39. An infrared (IR) imager, comprising:

an addressing circuit; and a pixel array coupled to the addressing circuit, wherein the pixel array includes a plurality of IR sensitive pixels, each pixel including:
  a first cantilevered beam connected to a substrate assembly and disposed in a cavity of the substrate assembly, wherein the cavity is defined by a sidewall, the first cantilevered beam including a first spring portion and a first capacitor plate portion, wherein the first spring portion includes at least two materials having different coefficients of thermal expansion; and
  a second cantilevered beam connected to the substrate assembly and disposed in the cavity, the second cantilevered beam including a second spring portion and a second capacitor plate portion, wherein the second spring portion includes at least two materials having different coefficients of thermal expansion such that incident IR radiation causes the first and second spring portions to move laterally relative to the sidewall thereby creating a variable capacitance between the first and second capacitor plate portions.

40. The IR imager of claim 39, wherein:

the first cantilevered beam of each pixel further includes a first thermal isolation portion between the substrate assembly and the first spring portion; and the second cantilevered beam of each pixel further includes a second thermal isolation portion between the substrate assembly and the second spring portion.

41. The IR imager of claim 39, wherein:

the first cantilevered beam of each pixel includes a CMOS micromachined beam; and the second cantilevered beam of each pixel includes a CMOS micromachined beam.

42. The IR imager of claim 39, wherein:

the first spring portion of each pixel includes a metal layer and a dielectric layer with different coefficients of thermal expansion; and the second spring portion of each pixel includes a metal layer and a dielectric layer with different coefficients of thermal expansion.

43. The IR imager of claim 39, wherein each pixel further includes a frame connected to the substrate assembly and positioned around the first and second cantilevered beams.

44. The IR imager of claim 43, wherein each pixel further includes:

at least one post connected to the frame;

a plate connected to the post; and an IR absorbing material located on the plate.

45. The IR imager of claim 39, wherein each pixel further includes:

at least one post connected to one of the first and second cantilevered beams;

a plate connected to the post; and an IR absorbing material located on the plate.

46. The IR imager of claim 39, wherein:

the first capacitor plate portion of each pixel includes a beam having a plurality of finger beams extending therefrom; and the second capacitor plate portion of each pixel includes a beam having a plurality of finger beams extending therefrom such that the finger beams of the first capacitor plate portion are interleaved with the finger beams of the second capacitor plate portion.

47. The IR imager of claim 39, further comprising an interface circuit coupled to each pixel.

48. The IR imager of claim 47, further comprising a capacitance detection circuit coupled to the addressing circuit.

* * * * *